United States Patent
Mehdizadeh et al.

(10) Patent No.: US 11,623,246 B2
(45) Date of Patent: Apr. 11, 2023

(54) PIEZOELECTRIC MICROMACHINED ULTRASOUND TRANSDUCER DEVICE WITH PIEZOELECTRIC BARRIER LAYER

(71) Applicant: INVENSENSE, INC., San Jose, CA (US)

(72) Inventors: Emad Mehdizadeh, San Jose, CA (US); Bongsang Kim, Mountain View, CA (US); Chienliu Chang, San Jose, CA (US); Leonardo Baldasarre, San Jose, CA (US); Nikhil Apte, Palo Alto, CA (US); Xiaoyue Jiang, San Jose, CA (US); Mei-Lin Chan, San Jose, CA (US)

(73) Assignee: INVENSENSE, INC., San Jose, CA (US)

(*) Notice: Subject to any disclaimer, the term of this patent is extended or adjusted under 35 U.S.C. 154(b) by 1000 days.

(21) Appl. No.: 16/269,892

(22) Filed: Feb. 7, 2019

(65) Prior Publication Data
US 2019/0262865 A1  Aug. 29, 2019

Related U.S. Application Data

(60) Provisional application No. 62/635,479, filed on Feb. 26, 2018.

(51) Int. Cl.
*B06B 1/06* (2006.01)
*B06B 1/02* (2006.01)
(Continued)

(52) U.S. Cl.
CPC .......... *B06B 1/0662* (2013.01); *B06B 1/0207* (2013.01); *B06B 1/0622* (2013.01);
(Continued)

(58) Field of Classification Search
CPC ... B06B 1/0207; B06B 1/0622; B06B 1/0644; B06B 1/0662; B06B 2201/55;
(Continued)

(56) References Cited

U.S. PATENT DOCUMENTS 7,630,114 B2  12/2009 Wang
7,728,487 B2   6/2010 Adachi
(Continued)

FOREIGN PATENT DOCUMENTS

CN  104810469 A  7/2015
TW     I516768 B  1/2016
(Continued)

OTHER PUBLICATIONS

PCT International Search Report for International Application No. PCT/US2019/017826, dated Jul. 25, 2019 (15 pages).
(Continued)

*Primary Examiner* — Shawki S Ismail
*Assistant Examiner* — Monica Mata
(74) *Attorney, Agent, or Firm* — Haley Guiliano LLP; Joshua Van Hoven; Stefan D. Osterbur (57) ABSTRACT

A piezoelectric micromachined ultrasound transducer (PMUT) device may include a plurality of layers including a structural layer, a piezoelectric layer, and electrode layers located on opposite sides of the piezoelectric layer. Conductive barrier layers may be located between the piezoelectric layer and the electrodes to the prevent diffusion of the piezoelectric layer into the electrode layers.

19 Claims, 10 Drawing Sheets

(51) Int. Cl.
  *H01L 41/04* (2006.01)
  *H01L 41/047* (2006.01)
  *H01L 41/08* (2006.01)
  *H01L 41/187* (2006.01)
  *H01L 41/29* (2013.01)
  *H01L 41/332* (2013.01)
  *H01L 41/313* (2013.01)
  *G06V 40/13* (2022.01)

(52) U.S. Cl.
  CPC .......... *B06B 1/0644* (2013.01); *H01L 41/042* (2013.01); *H01L 41/0475* (2013.01); *H01L 41/0478* (2013.01); *H01L 41/0825* (2013.01); *H01L 41/1876* (2013.01); *H01L 41/29* (2013.01); *H01L 41/313* (2013.01); *H01L 41/332* (2013.01); *B06B 2201/55* (2013.01); *B06B 2201/70* (2013.01); *G06V 40/1306* (2022.01)

(58) Field of Classification Search
  CPC ... B06B 2201/70; H01L 41/29; H01L 41/042; H01L 41/313; H01L 41/332; H01L 41/0475; H01L 41/0478; H01L 41/0825; H01L 41/1876; G06V 40/1306
  USPC .......................................... 310/316
  See application file for complete search history.

(56) References Cited

U.S. PATENT DOCUMENTS

| | | |
|---|---|---|
| 9,343,357 B2 | 5/2016 | Xu |
| 2002/0190814 A1 | 12/2002 | Yamada |
| 2007/0029593 A1* | 2/2007 | Ramesh ............ H01L 27/11507 |
| | | 257/295 |
| 2007/0214621 A1 | 9/2007 | Furuya |
| 2013/0278111 A1 | 10/2013 | Sammoura |
| 2013/0322663 A1 | 12/2013 | Melcher |
| 2014/0180117 A1 | 6/2014 | Van Hoven |
| 2015/0357375 A1* | 12/2015 | Tsai ................... H01L 41/1132 |
| | | 257/416 |
| 2016/0315247 A1 | 10/2016 | Boser |

FOREIGN PATENT DOCUMENTS

| | | |
|---|---|---|
| TW | I550923 B | 9/2016 |
| WO | WO2008034940 | 3/2008 |
| WO | WO2016040333 | 3/2016 |

OTHER PUBLICATIONS

Office Action received for TW Patent Application No. 108106237, dated Jul. 15, 2022, 15 pages (Original Document Only).

* cited by examiner

FIG. 16

# PIEZOELECTRIC MICROMACHINED ULTRASOUND TRANSDUCER DEVICE WITH PIEZOELECTRIC BARRIER LAYER

CROSS-REFERENCE TO RELATED APPLICATIONS

This application claims priority benefit under 35 U.S.C. § 119(e) from U.S. provisional application No. 62/635,479 entitled "PZT Process Flow for MEMS Sensor," filed on Feb. 26, 2018. The aforementioned, earlier-filed application is hereby incorporated by reference herein in its entirety.

FIELD OF INVENTION

This application relates to a piezoelectric micromachined ultrasound transducer (PMUT) device and more specifically, to conductive barrier layers in the PMUT device.

BACKGROUND

A piezoelectric micromachined ultrasound transducer (PMUT) device may be utilized in a variety of applications. The PMUT device may include a piezoelectric material that provides an electro-mechanical response based on a given input signal. For example, when an electrical signal is applied to the piezoelectric material, the material may exhibit a mechanical response. In response to a received mechanical signal, the piezoelectric material may exhibit an electrical response.

One application of PMUT devices may be in ultrasonic applications. By designing the PMUT device or multiple PMUT devices in a particular manner, desired signals may be produced and/or sensed. An exemplary sensor that utilizes PMUT technology may be a PMUT fingerprint sensor. Portions of an array of PMUT devices may be selectively activated by electrical signals to output corresponding ultrasonic signals that are transmitted in the direction of a finger. Portions of the array of PMUT devices may also be selectively activated to sense the reflections of the transmitted ultrasonic signal based on the electrical output due to the mechanical forces exerted by the reflected signals. A suitable number of PMUT devices and arrays may be implemented in order to measure the contours of the user's fingerprint based on the reflected signals.

A PMUT sensor may thus include a complex configuration of PMUT devices and arrays based on a variety of applications such as fingerprint sensing, and in a variety of end-products such as small portable devices. As PMUT sensors increase in complexity, and as the potential applications of PMUT sensors increase, signal strength, device size, and power usage considerations implicated by conventional designs may limit the adoption of PMUT sensors.

SUMMARY

In an embodiment of the present disclosure, a piezoelectric micromachined ultrasound transducer (PMUT) device may comprise a structural layer, an electrical component layer, a first electrode located between the structural layer and the electrical component layer, and a second electrode located between the structural layer and the electrical component layer. The PMUT device may further comprise a piezoelectric layer located between the first electrode and the second electrode, wherein the piezoelectric layer generates a mechanical response in response to a signal applied between the first electrode and the second electrode, and wherein the piezoelectric layer generates an electrical signal between the first electrode and the second electrode in response to a mechanical stress applied to the piezoelectric layer. The PMUT device may further comprise one or more barrier layers, wherein the one or more barrier layers prevent diffusion of the piezoelectric layer into the first electrode and the second electrode.

In an embodiment of the present disclosure, a piezoelectric micromachined ultrasound transducer (PMUT) device may comprise a structural layer, an electrical component layer, a first electrode disposed adjacent to and over the structural layer, and a second electrode disposed adjacent to and over the structural layer. The PMUT device may further comprise a piezoelectric layer located between the first electrode and the second electrode, wherein the piezoelectric layer generates a mechanical response in response to a signal applied between the first electrode and the second electrode, and wherein the piezoelectric layer generates an electrical signal between the first electrode and the second electrode in response to a mechanical stress applied to the piezoelectric layer. The PMUT device may further comprise one or more barrier layers, wherein the one or more barrier layers prevent diffusion of the piezoelectric layer into the first electrode and the second electrode.

In an embodiment of the present disclosure, a method for fabricating a piezoelectric micromachined ultrasound transducer (PMUT) device may comprise providing a structural layer, depositing a first conducting layer over the structural layer, depositing a first barrier layer over the first conducting layer, depositing a piezoelectric layer over the first barrier layer, depositing a second barrier layer over the piezoelectric layer, and depositing a second conducting layer over the structural layer. The method may further comprise patterning the second conducting layer, etching the piezoelectric layer based at least in part on the patterning of the second conducting layer, and depositing a third barrier layer over the second conducting layer, piezoelectric layer, and the first conducting layer.

BRIEF DESCRIPTION OF THE DRAWINGS

The above and other features of the present disclosure, its nature and various advantages will be more apparent upon consideration of the following detailed description, taken in conjunction with the accompanying drawings in which.

DETAILED DESCRIPTION OF THE DRAWINGS

Microelectromechanical systems (MEMS) may refer to a class of structure or devices fabricated using semiconductor-like processes and exhibiting mechanical characteristics such as the ability to move or deform. MEMS often, but not always interact with electrical signals. MEMS devices include, but are not limited to, gyroscopes, accelerometers, magnetometers, pressure sensors, and radio-frequency components. Silicon wafers containing MEMS structures may be referred to as MEMS layers.

Fingerprint sensing through MEMS devices may be achieved through an array of piezoelectric micromachined ultrasound transducer (PMUT) devices, and an array of cavities that has been attached to the array of piezoelectric transducers to form an array of resonators, e.g., an array of MEMS piezoelectric acoustic resonators. A resonator, e.g., a membrane resonator, a Helmholtz resonator, etc. of the array of resonators can be associated with a first frequency response, e.g., a resonant frequency of the resonator, a Q factor of the resonator, etc. corresponding to a determination that the resonator has a non-touch baseline condition. Then a second frequency response, e.g., increase in resonant frequency of the resonator, decrease in Q factor of the resonator, etc. corresponding to a determination that the resonator has been touched, e.g., by the finger ridge. Thus, the finger print map can be determined according to the frequency response changes of resonators in the resonator array. PMUT devices may have additional applications in medical imaging, where an image of a biometric surface may be captured by an array of PMUT devices. For example, an array of PMUT devices may be operated at a suitable power and frequency to generate ultrasonic signals suitable for providing ultrasonic signals to a region of interest, receiving reflections of those signals, and generating a composite image based on the reflected signals.

A piezoelectric material such as lead zirconate titanate (PZT) of the PMUT device may be fabricated within a particular portion of the PMUT device and may be located adjacent to a variety of other materials and components of the PMUT device. For example, a layer of piezoelectric material may be located and patterned in a manner to provide a desired acoustic output and/or to accurately receive reflected acoustic signals. In some embodiments, conductive electrodes may be electrically coupled on each side of the piezoelectric material and coupled to respective electrical circuitry (e.g., at an external or understanding electrical layer such as a CMOS layer) such that an electrical signal may be applied across the piezoelectric material or sensed from piezoelectric material. In this manner, the piezoelectric material may provide an electrical connection between respective electrodes.

Conductive barrier layers may be located between the respective electrodes and the piezoelectric layer, and may be selected to provide suitable conductive properties while limiting the diffusion of the piezoelectric material into the electrode layers during the fabrication and processing of the PMUT device. Other layers and components of the MEMS sensors such as structural layer, standoffs, traces for the electrodes, bonding layers, etc., may also be located adjacent to the piezoelectric layer such that diffusion of the piezoelectric materials during fabrication and processing may occur. Accordingly, in some embodiments additional barrier layers may be added between the piezoelectric layers and these other layers. In some embodiments these additional barrier layers may not be conductive and instead may be selected to insulate the piezoelectric layer from the other layers.

Figure 1:
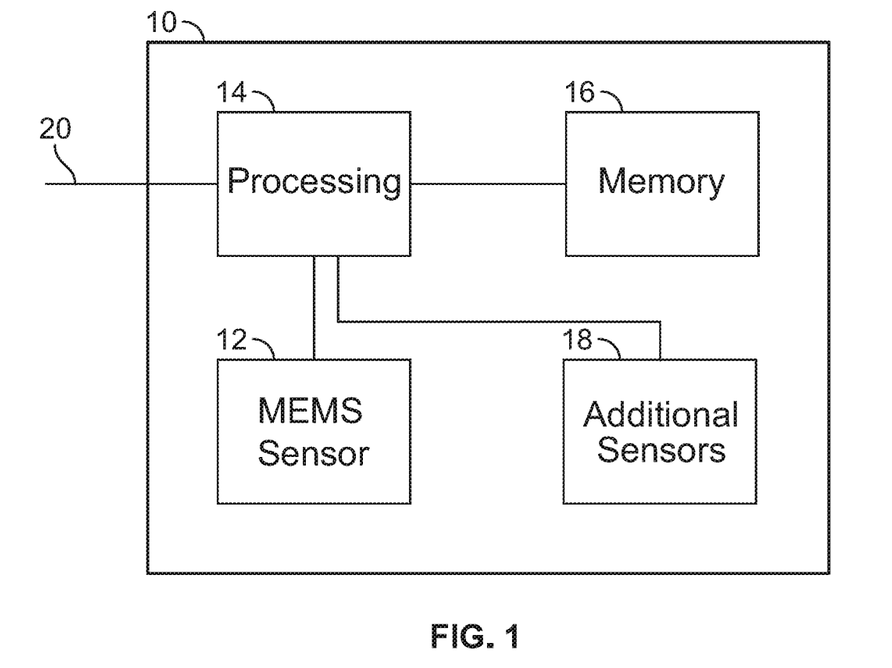
FIG. 1 depicts an exemplary fingerprint sensing system in accordance with some embodiments of the present disclosure.

FIG. 1 depicts an exemplary PMUT sensor system such as a fingerprint sensing system 10 in accordance with some embodiments of the present disclosure. Although particular components are depicted in FIG. 1, it will be understood that other suitable combinations of sensors, processing components, memory, and other circuitry may be utilized as necessary for different applications and systems. In an embodiment as described herein, the PMUT sensor system may include at least a MEMS piezoelectric sensor 12 and supporting circuitry, such as processing circuitry 14 and memory 16. In some embodiments, one or more additional sensors 18 (e.g., MEMS gyroscopes, MEMS accelerometers, MEMS pressure sensors, and a compass) may be included within the fingerprint sensing system 10 to provide an integrated identification and movement processing unit (e.g., including 3 axes of MEMS gyroscope sensing, 3 axes of MEMS accelerometer sensing, pressure sensor, and compass).

Processing circuitry 14 may include one or more components providing necessary processing based on the requirements of the fingerprint processing system 10. In some embodiments, processing circuitry 14 may include hardware control logic that may be integrated within a chip of a sensor (e.g., on a substrate or cap of a MEMS piezoelectric sensor 12 or additional sensors 18, or on an adjacent portion of a chip to the MEMS piezoelectric sensor 12 or additional sensors 18) to control the operation of the MEMS piezoelectric sensor 12 or additional sensors 18 and perform aspects of processing for the MEMS piezoelectric sensor 12 or additional sensors 18. In some embodiments, the MEMS piezoelectric sensor 12 and additional sensors 18 may include one or more registers that allow aspects of the operation of hardware control logic to be modified (e.g., by modifying a value of a register). For example, in some embodiments one, or registers may be modified to change values (e.g., resistors, capacitors, filters, etc.) associated with the processing circuitry described herein. In some embodiments, processing circuitry 14 may also include a processor such as a microprocessor that executes software instructions, e.g., that are stored in memory 16. The microprocessor may control the operation of the MEMS piezoelectric sensor 12 by interacting with the hardware control logic, and process signals received from MEMS piezoelectric sensor 12. The microprocessor may interact with other sensors in a similar manner.

A piezoelectric PMUT structure may comprises a silicon seed layer with a piezoelectric layer consisting of a piezoelectric material (e.g., PZT). Because of its tendency to diffuse into other materials, a piezoelectric layer within a structure that lacks a buffer barrier layer may experience piezoelectric material diffusion. This diffusion causes the crystalline structure to change which in turn, alters the piezoelectric properties.

A piezoelectric PMUT structure may include a barrier layer in order to prevent piezoelectric material diffusion. For example, the barrier layer may be composed of an aluminum oxide $Al_2O_3$, $TiO_2$, $SiO_2$, Ir, $LaNiO_3$ (LNO), $Si_3N_4$, Yttria-stabilized Zirconia (YSZ), MgO, $TiO_x$, or $ZrO_2$. Despite the addition of this barrier layer, the piezoelectric layer may still diffuse through a pinhole. In another example, a barrier layer consisting of a YSZ material that substantially overlaps the piezoelectric layer may prevent diffusion and without being subject to pinholes.

A piezoelectric PMUT structure may comprise a MEMS layer and CMOS layer bonded together by a eutectic bond. A detailed explanation of the process to develop this structure will be described in FIGS. 7-19. The barrier layers can prevent the potential diffusion of material from the piezoelectric layer into the silicon device layer or may function as an insulating barrier to isolate electrical connections from the CMOS layer and respective electrodes.

Figure 2:
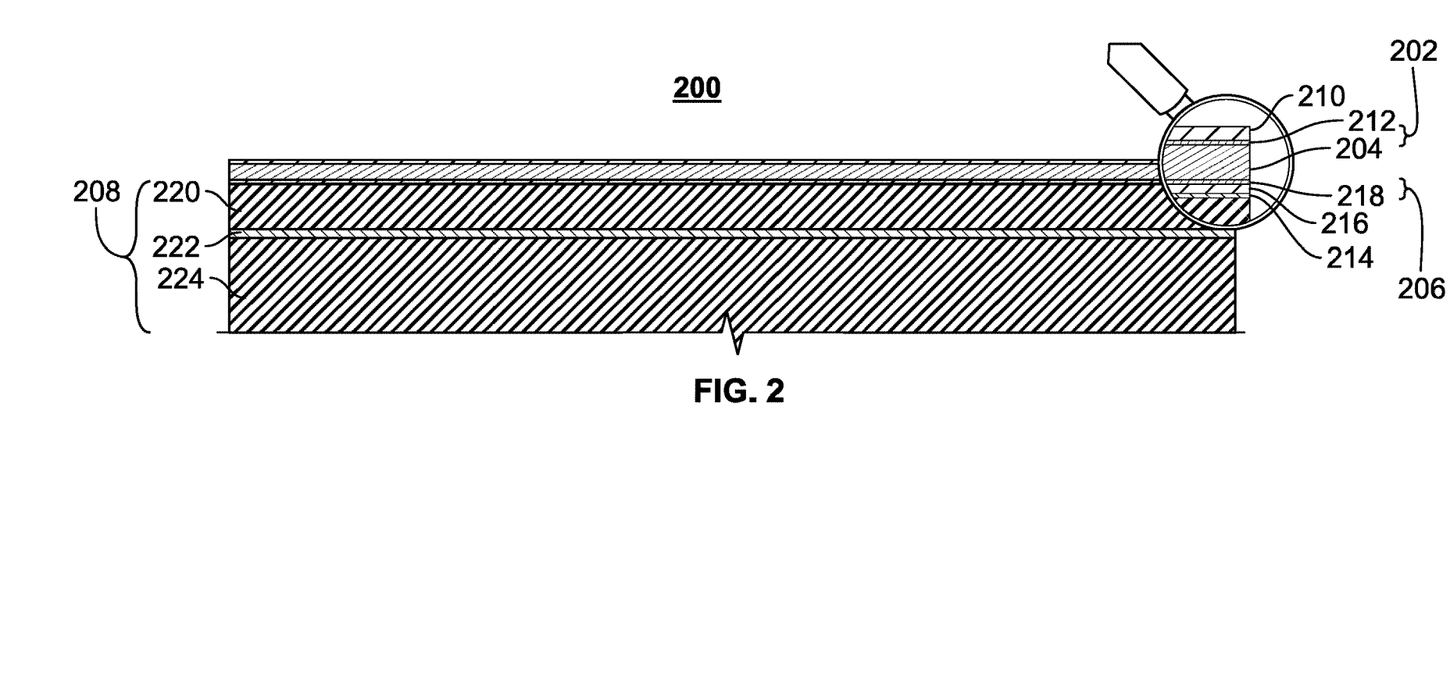
FIG. 2 shows a stacked SOI structure in accordance with one embodiment of the present disclosure.

FIG. 2 shows a stacked SOI structure 200 in accordance with one embodiment of the present disclosure. In an embodiment of the present disclosure, the fabrication of the MEMS layer 602 begins with the stacked SOI structure 200 that may be divided into three sections: a first electrode 202, piezoelectric layer 204, second electrode 206, and SOI layer 208. The structure 200 is comprised of a piezoelectric layer 204 between two electrode layers first electrode 202 and second electrode 206, which reside on top portion of the SOI structure 200. The first electrode 202 is further comprised of a platinum (Pt) layer 210 over an SRO layer 212. The Pt layer 210 may provide crystalline continuity between PZT structure and the seed layer. The SRO layer 212 may be a conductive oxide and may act as a diffusion barrier to prevent diffusion from the piezoelectric layer 204 into the Pt layer 210. Additionally, the SRO layer 212 may reduce the likelihood that metal electrodes diffuse into the PZT or any other piezoelectric film that is used in the piezoelectric layer 204. The piezoelectric layer 204 may function as a transduction film by converting electric energy to mechanical energy. The second electrode 206 is further comprised of a Yttria-stabilized zirconia (YSZ) layer 214, a platinum layer 216 over the YSZ layer 214, and a SRO layer 218 over the Pt layer 216. A seed layer such as the YSZ layer 214 functions as an insulating buffer layer due to crystallization along a unique orientation leading to a well-aligned and high quality piezoelectric film. The Pt layer 210 can act as a ground electrode that completes a path for current through the PZT layer 204. The SRO layer 218 may comprise a conductive oxide and may serve as a diffusion barrier to prevent PZT in the piezoelectric layer 204 from diffusing into the Pt layer 216 of the second electrode 206. The SOI layer 208 is further comprised of a silicon device layer 220, a buried oxide (BOX) layer 222, and a silicon handle layer 224. The BOX layer 222, composed of insulating silicon dioxide, may be deposited over a silicon handle layer 224, which may also be referred to as a support layer. The BOX layer 222 can function as an etch stop that functions as a barrier to stop further etching. The silicon device layer 220 is then deposited over the BOX layer 222 to complete the SOI layer 208.

Instead of a SOI, a polysilicon on insulator (POI) may be used to stack the first electrode 202, piezoelectric layer 204, and second electrode 206. The silicon device layer performs a passive layer role in the PMUT device, creating a neutral axis in the device stack and therefore, can be replace with any other material such as germanium, silicon dioxide, nitride, or aluminum oxide.

Figure 3:
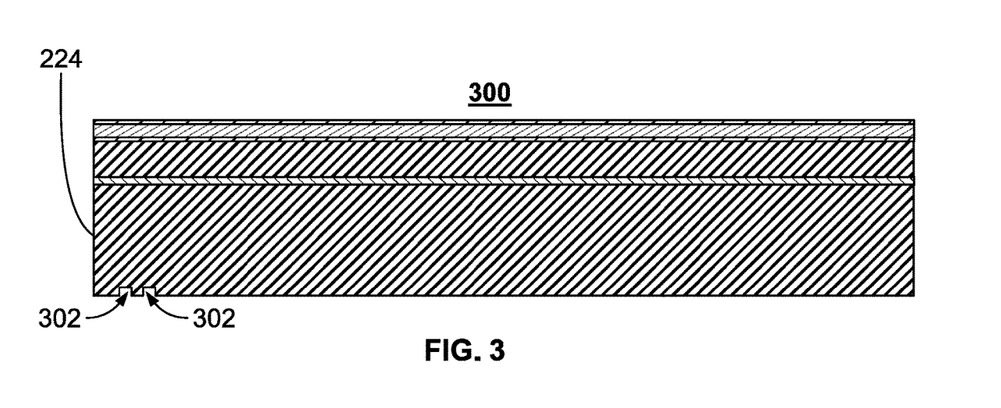
FIG. 3 shows a stacked SOI structure with backside alignment marks in accordance with one embodiment of the present disclosure.

FIG. 3 shows a stacked SOI structure 300 with backside alignment marks in accordance with one embodiment of the present disclosure. Stacked SOI structure 300 can be created by applying backside alignment marks on the stacked SOI structure 200. In one embodiment, the stacked SOI structure 200 can have alignment marks 302 patterned on the back of the wafer and into the silicon handle layer 224.

Figure 4:
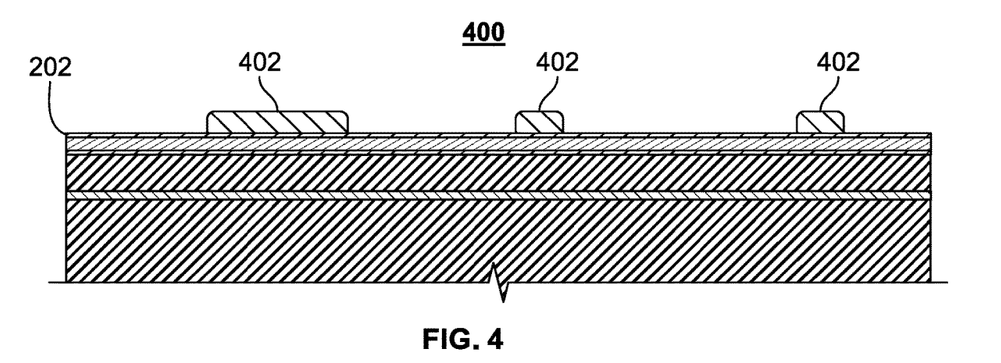
FIG. 4 shows a stacked SOI structure with oxide deposition and standoff patterning in accordance with one embodiment of the present disclosure.

FIG. 4 shows a stacked SOI structure 400 with oxide deposition and standoff patterning in accordance with one embodiment of the present disclosure. Stacked SOI structure 400 can be created by depositing and patterning oxide standoffs 402 on the stacked SOI structure 300. Depositing and patterning oxide onto the first electrode 202 creates standoffs needed for bonding with, although not depicted in FIG. 4, the CMOS layer 604. Other insulating layers such as aluminum oxide and silicon nitride can also be used as material for the standoff.

Figure 5:
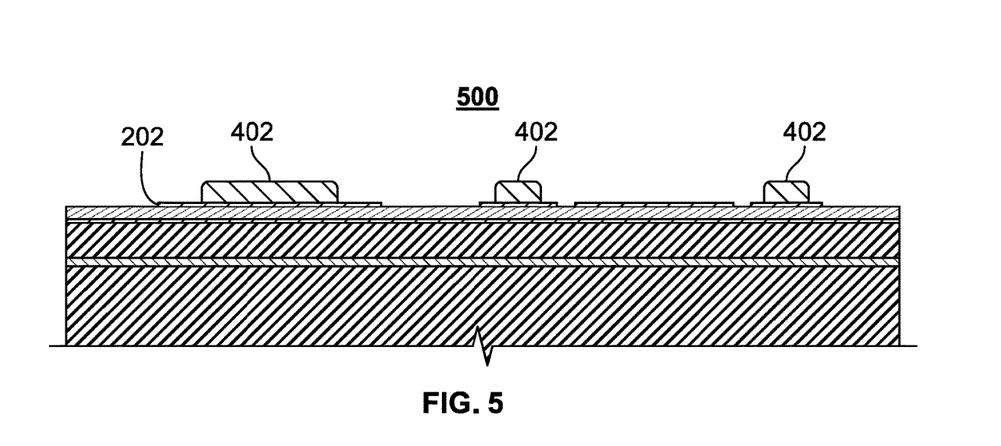
FIG. 5 shows a stacked SOI structure with a patterned top electrode layer in accordance with one embodiment of the present disclosure.

FIG. 5 shows a stacked SOI structure 500 with a patterned top electrode layer in accordance with one embodiment of the present disclosure. Stacked SOI structure 500 can be created by patterning the first electrode 202 of the stacked SOI structure 400. The first electrode 202 may be patterned before or after the standoff 402 is deposited and patterned.

Figure 6:
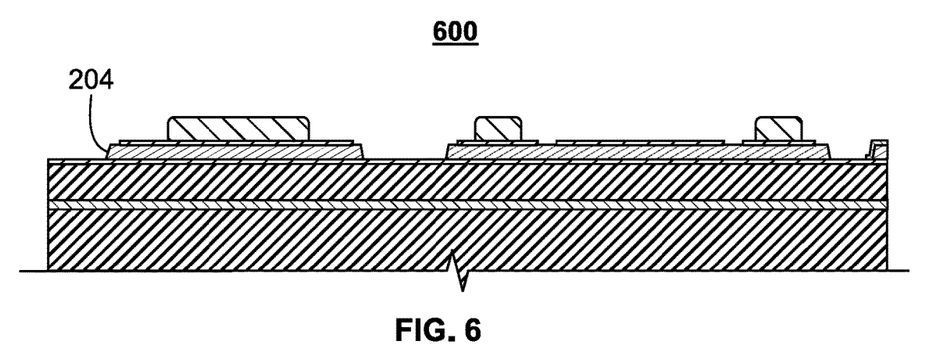
FIG. 6 shows a stacked SOI structure with an etched piezoelectric in accordance with one embodiment of the present disclosure.

FIG. 6 shows a stacked SOI structure 600 with an etched piezoelectric in accordance with one embodiment of the present disclosure. Stacked SOI structure 600 can be created by patterning the piezoelectric layer 204 of stacked SOI structure 500. A hardmask or photoresist layer may be used to pattern the piezoelectric layer 204. The patterning may also be called piezoelectric etching or via patterning.

Figure 7:
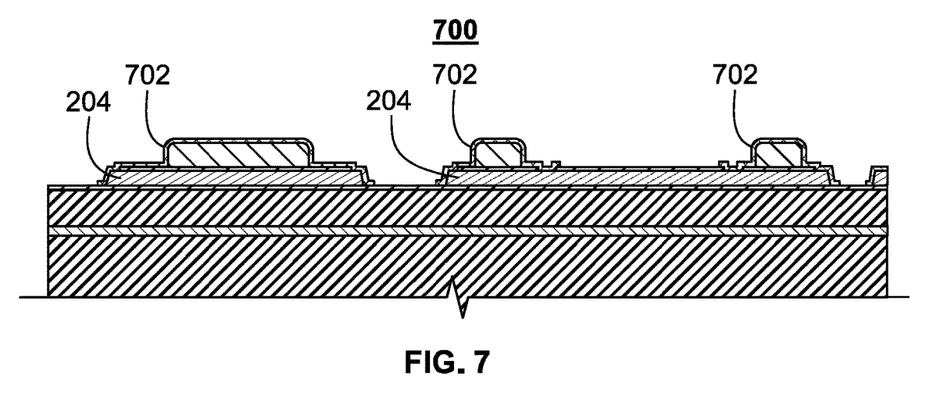
FIG. 7 shows a stacked SOI structure with a patterned insulating layer in accordance with one embodiment of the present disclosure.
Figure 13:
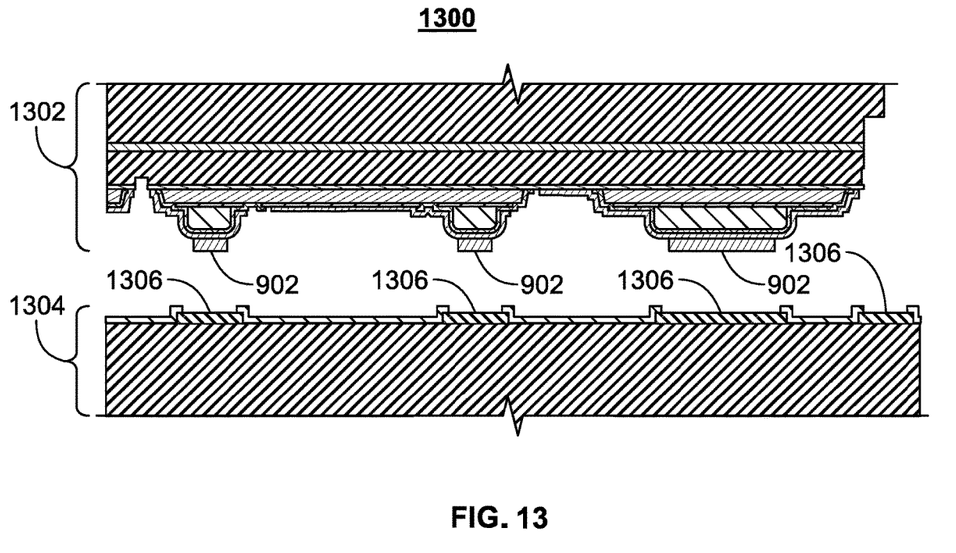
FIG. 13 depicts the eutectic bonding of the MEMS layer and CMOS layer in accordance with one embodiment of the present disclosure.
Figure 14:
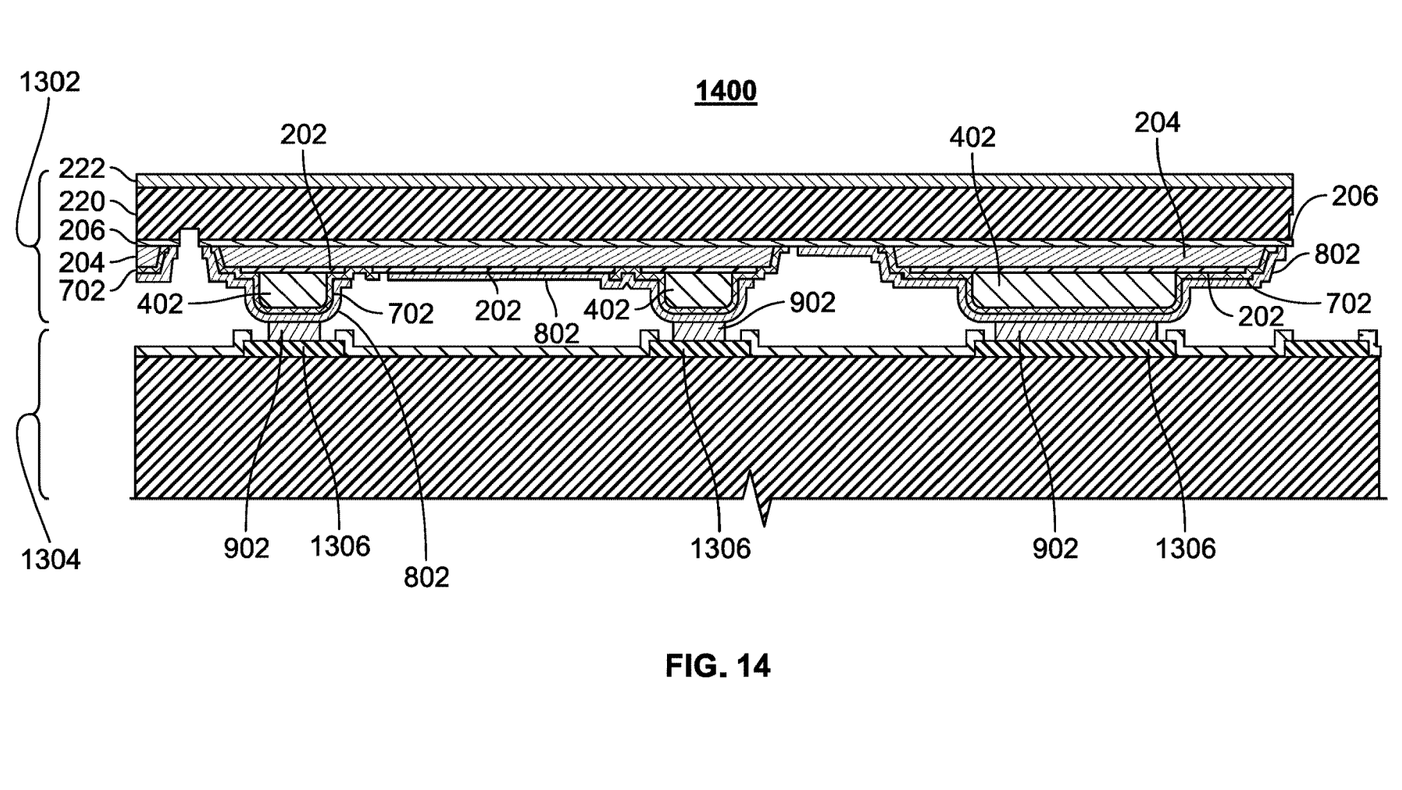
FIG. 14 shows a PMUT structure including a piezoelectric layer in accordance with one embodiment of the present disclosure.

FIG. 7 shows a stacked SOI structure 700 with a patterned insulating layer in accordance with one embodiment of the present disclosure. Stacked SOI structure 700 can be created by depositing and patterning an insulating layer 702 on stacked SOI structure 600. The insulating layer 702 comprised of a material such as silicon dioxide, silicon nitride, aluminum oxide, polyimide, or other potential materials serves to eliminate diffusion of PZT into third electrode 802 and reduce parasitic capacitance for the device 204. The piezoelectric layer 204 may contain hazardous materials. For example, a piezoelectric layer comprising lead not only may diffuse into its neighboring electrode layers, thereby altering the behavior of the electrode layers, but may be inherently hazardous to the user and environment. Insulating layer 702 is used to ensure the hazardous materials in piezoelectric layer 204 is segregated from the outside environment. The insulating layer 702 may also alleviate or fully eliminate the parasitic coming from the electrode layer. Eliminating the parasitic is critical if the piezoelectric layer 204 is composed of a piezoelectric layer such as PZT, as PZT has a large dielectric constant. The piezoelectric layer may alternatively be composed of lead magnesium niobite-lead titanate (PMN-PT) or lead zinc niobite-lead titanate (PZN-PT). The addition of magnesium and niobite to PZT in PMN-PT may increase the piezoelectric coefficients. Insulating layer 702 may be patterned to open the active area of the MEMS device for electrode contacts and via locations added later in the process for creating PMUT device 600. One example of the electrode contacts and via locations is depicted in FIGS. 13 and 14. Depositing the insulating layer 702 may be done before or after the standoff deposition and patterning. The insulating layer may also be referred to as an insulating film.

Figure 8:
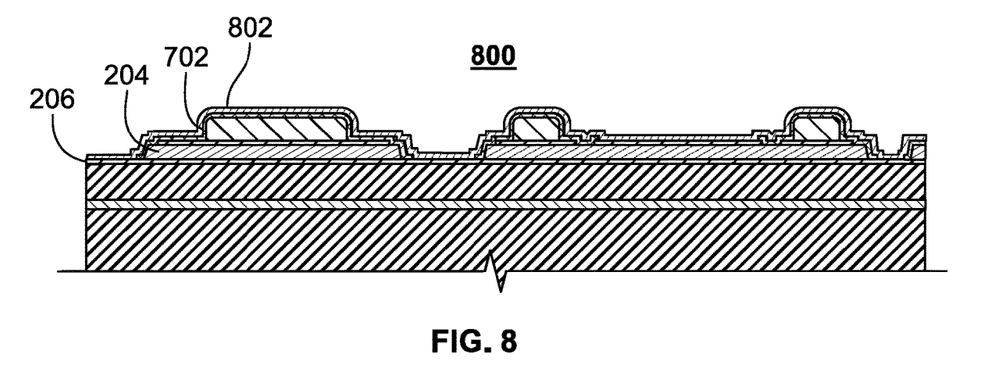
FIG. 8 shows a stacked SOI structure with an additional top electrode layer in accordance with one embodiment of the present disclosure.

FIG. 8 shows a stacked SOI structure 800 with an additional top electrode layer in accordance with one embodiment of the present disclosure. Stacked SOI structure 800 can be created by depositing an third electrode 802 on stacked SOI structure 700. The third electrode 802 may comprise aluminum, titanium nitride (TiN), or any other conductive material. The third electrode 802 serves to enable contact with the CMOS layer and to make contact with the second electrode 206 at via locations. The insulating layer 702 may serve as a diffusion barrier between the piezoelectric layer 204 and the third electrode 802.

Figure 9:
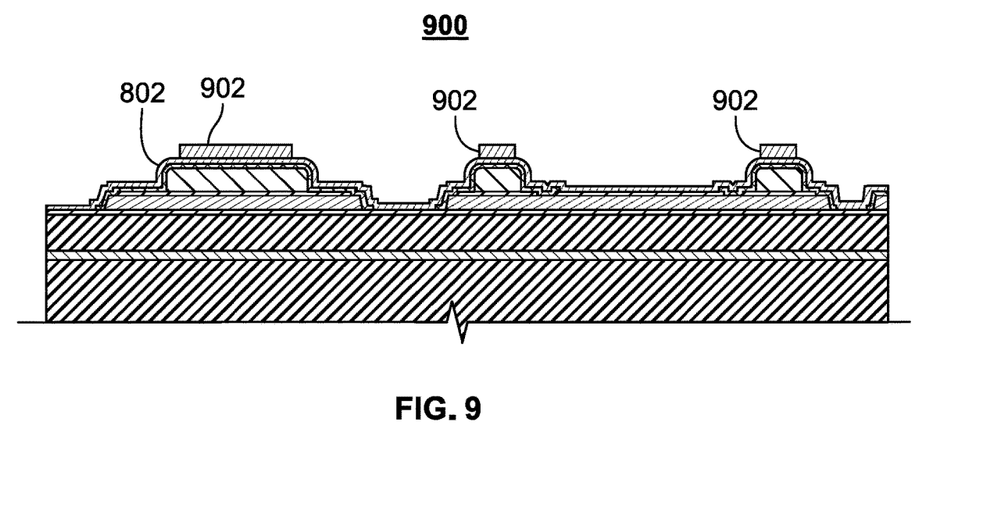
FIG. 9 shows a stacked SOI structure with a patterned germanium layer in accordance with one embodiment of the present disclosure.

FIG. 9 shows a stacked SOI structure 900 with a patterned germanium layer in accordance with one embodiment of the present disclosure. Stacked SOI structure 900 can be created by depositing and patterning a germanium layer 902 on stacked SOI structure 800. The germanium layer 902 enables a eutectic bond with the contact on the CMOS layer. Alternatively, tin, silicon, and indium may be deposited and patterned over the third electrode 802 in place of germanium. The germanium layer 902 can be deposited and patterned immediately before the additional top layer 802 is patterned or deposition can be delayed until after the third electrode 802 is patterned.

Figure 10:
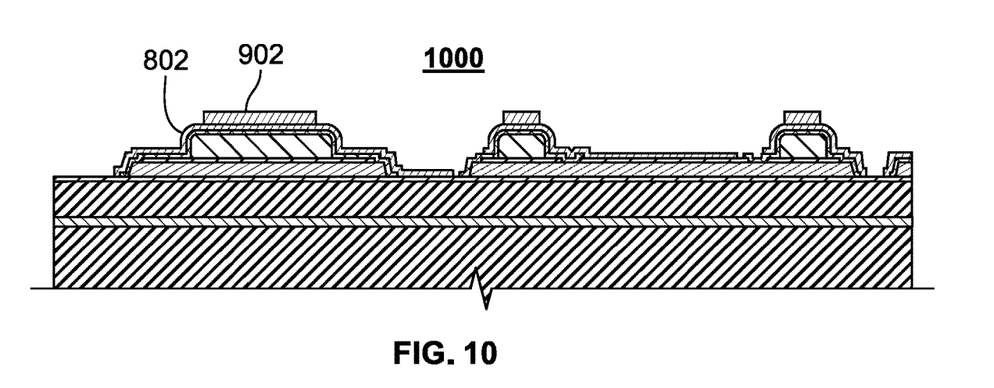
FIG. 10 shows a stacked SOI structure with a patterned additional top electrode layer in accordance with one embodiment of the present disclosure.

FIG. 10 shows a stacked SOI structure 1000 with a patterned additional top electrode layer in accordance with one embodiment of the present disclosure. Stacked SOI structure 1000 can be obtained by patterning the third electrode 802 of stacked SOI structure 800. Patterning the third electrode 802 can be done before the patterning and deposition of the germanium layer 902 or layer of other candidate materials that enable the eutectic bond with the contact on the CMOS layer.

Figure 11:
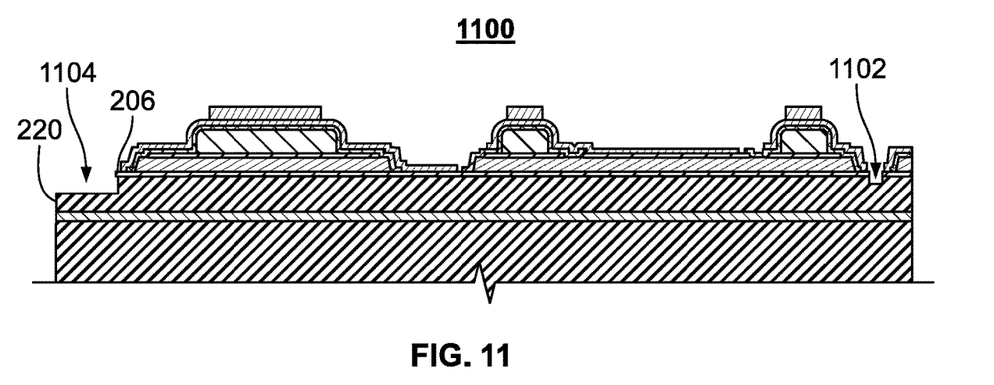
FIG. 11 shows a stacked SOI structure with a shallow trench and reveal area in accordance with one embodiment of the present disclosure.

FIG. 11 shows a stacked SOI structure 1100 with a shallow trench and reveal area in accordance with one embodiment of the present disclosure. Stacked SOI structure 1100 can be achieved by creating a shallow trench 1102 in the second electrode 206 of stacked SOI structure 1000. The shallow trench 1102 may serve to isolate PMUT device 600 from neighboring PMUT devices, as each PMUT device corresponds to a cell in an array (e.g., a pixel in an OLED display). The shallow trench 1102 is created through an etching process, and the etch can be extended into the silicon device layer 220. Additionally, a reveal area 1104 may be created on stacked SOI structure 1000. The reveal area 1104 can expose the CMOS pad in the subsequent steps. The PMUT device 600 may function properly without the shallow trench 1102 and/or the reveal area 1104, and as such, both the shallow trench 1102 and the reveal area 1104 are optional.

Figure 12:
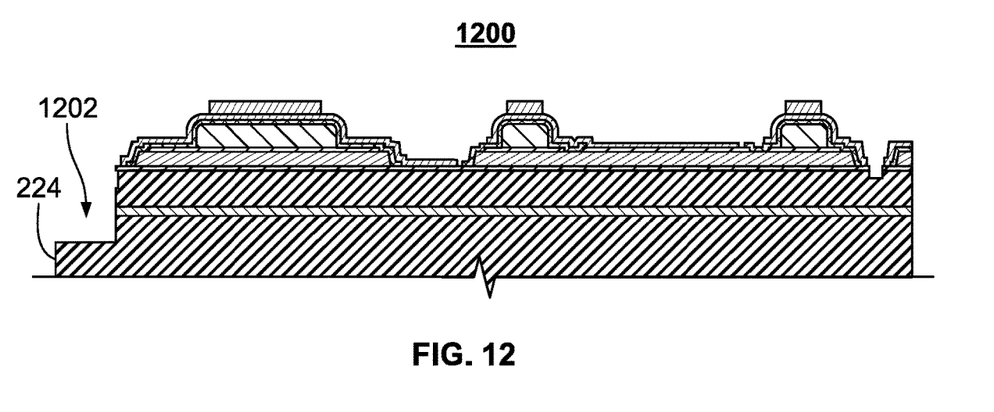
FIG. 12 shows a stacked SOI structure with a patterned recess in accordance with one embodiment of the present disclosure.

FIG. 12 shows a stacked SOI structure 1200 with a patterned recess in accordance with one embodiment of the present disclosure. Stacked SOI structure 1200 can be created by patterning a recess area 1202 into stacked SOI structure 1100. In some embodiments, the recess area 1202 exposes the CMOS pad. The recess area 1202 may be extended into the silicon handle layer 224 in this step.

FIG. 13 depicts the eutectic bonding of the MEMS layer 1302 and CMOS layer 1304 in accordance with one embodiment of the present disclosure. The stacked SOI structure 1200, which may also be referred to as a MEMS layer 1302, is bonded to a CMOS layer 1304 by a eutectic bond via the germanium layer 902 of the MEMS layer 1302 and the contacts 1306 of the CMOS layer 1304. The contacts 1306 may be composed of aluminum. In some embodiments, the CMOS layer 1304 further comprises a protective passivation layer that has been patterned such that contacts 1306 are exposed for bonding with the MEMS layer 1302.

FIG. 14 shows a piezoelectric PMUT structure 1400 in accordance with one embodiment of the present disclosure. The piezoelectric PMUT structure 1400 is obtained once the eutectic bonding is completed, and is represented at an abstract level of detail in FIG. 6. The handle layer 224, though not depicted in FIG. 14, may then be removed to release the structures. To remove the handle layer 224, one method is to use chemical mechanical polishing (CMP) for a majority of the thickness of handle layer 224 and use a dry etch step to remove the final microns. The BOX layer 222 can work as an etch stop to stop further etching. The MEMS layer comprises a BOX layer 222 that may be composed of silicon dioxide. The silicon device layer 220 is deposited over the BOX layer 222. The second electrode 206 is deposited over the silicon device layer 220.

Over the platinum layer 216, a barrier layer 218 exists to prevent the diffusion of material grown onto the second electrode 206 into the silicon device layer 220. A piezoelectric layer 204 is deposited over the platinum layer 216 and the barrier layer 218 (e.g., as depicted in FIG. 2). This piezoelectric layer 204 may comprise a piezoelectric material such as PZT and is a conductive layer. The first electrode 202, deposited over the piezoelectric layer 204, comprises one end of a path for current to flow through the piezoelectric layer 204 between the first electrode 202 and second electrode 206. This current may originate from the CMOS layer 1304, and a third electrode 802 between the CMOS layer 1304 and the MEMS layer 1302 can carry the electrical signal from the CMOS layer 1304 to the first electrode 202 and/or second electrode 206. The applied electrical potential between electrode layers create electric fields to induce strains within the piezoelectric material. Some cells in the PMUT array may be designated for signals from the CMOS layer 1304 to the first electrode 202 while others are designated for signals from the CMOS layer 1304 to the second electrode 206.

A barrier layer 212 may exist between the platinum layer 210 and the piezoelectric layer 204 to prevent diffusion of material from the piezoelectric layer 204 into the platinum layer 210. Due to the conductive nature of the piezoelectric layer 204, a barrier layer 702 may exist between the piezoelectric layer and a third electrode 802 that provides an insulating barrier to isolate the electrical signals directed to or from one electrode layer from being improperly received by another electrode layer.

To properly bond the CMOS layer 1304 and MEMS layer 1302, standoffs 402 comprising material such as silicon dioxide, silicon nitride, or silicon are deposited over the first electrode 202. The standoffs 402 may provide separation between the MEMS layer 1302 and CMOS layer 1304 to prevent unwanted contact between the MEMS layer 1302 and the CMOS layer 1304. Additionally, the standoffs 402 can determine the gap between the MEMS layer 1302 and the CMOS layer 1304. The third electrode 802, with a barrier layer 702 between the standoff 402 and the third electrode 802, makes electrical contact with the CMOS layer 1304 through germanium layer 902 that are deposited and patterned on the MEMS layer 1302. The germanium layer 902 enable a eutectic bond with the CMOS layer 1304. The CMOS layer 1304 may comprise a silicon layer. In the case of germanium layer 902 and a CMOS layer 1304 comprised of silicon, there may be contacts 1306 composed of aluminum deposited and patterned on the CMOS layer 1304.

Figure 15:
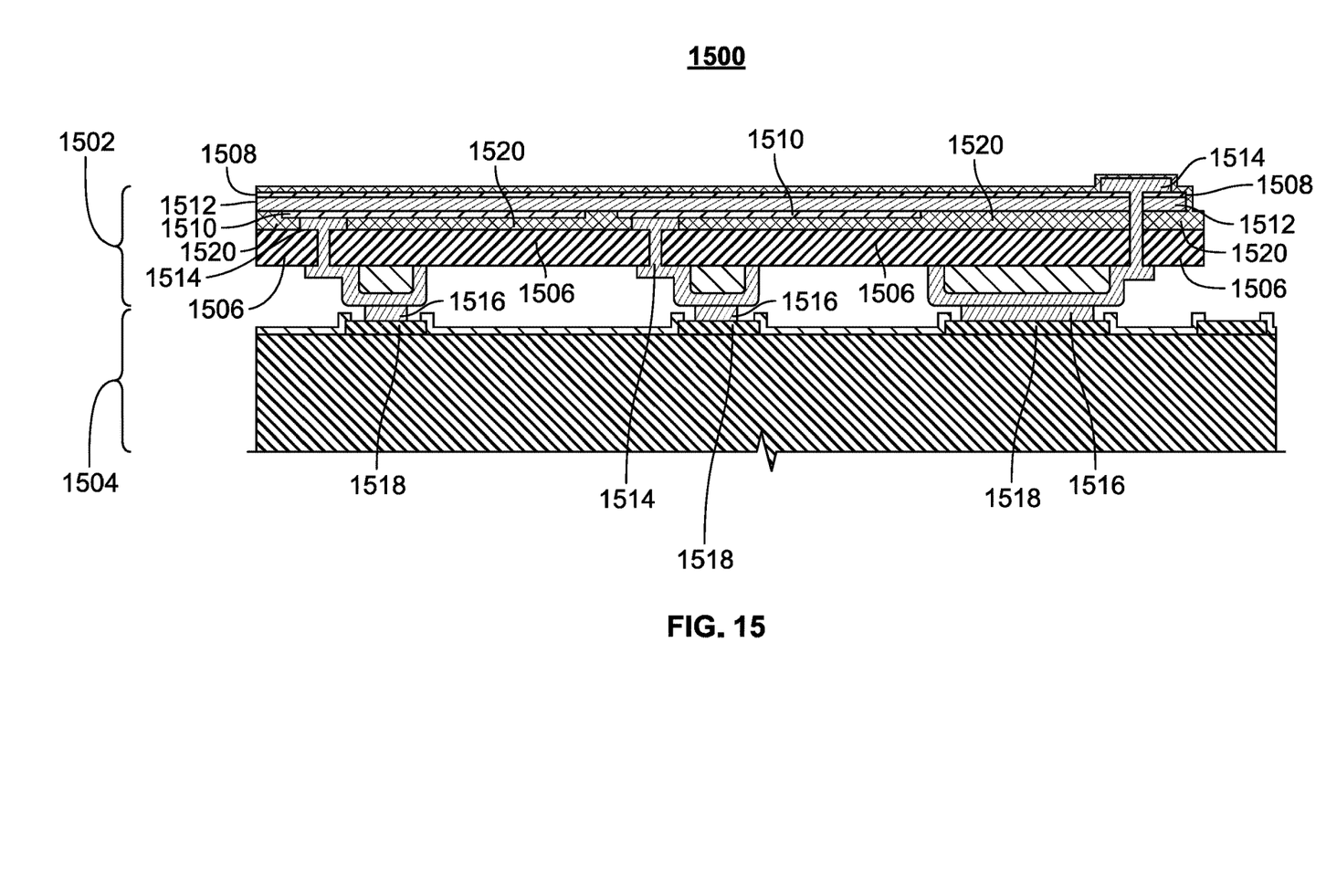
FIG. 15 shows a PMUT structure including a piezoelectric layer with a dielectric structural layer in accordance with one embodiment of the present disclosure.

FIG. 15 shows a PZT PMUT structure 1500 with a dielectric structural layer in accordance with one embodiment of the present disclosure. The PZT PMUT structure 1500 may be comprised of a MEMS layer 1502 and a CMOS layer 1504, where the MEMS layer includes the dielectric structural layer 1506.

In one embodiment, the MEMS layer 1502 comprises a piezoelectric layer 1512 between electrodes 1508 and 1510, and an conductive interconnect layer 1514 that provides an electrical wiring path from the germanium pads 1516 of the MEMS layer 1502 that are bonded with the contacts 1518 of the CMOS layer 1504. An insulating layer 1520 may function as an insulating layer and be composed of silicon dioxide, silicon nitride, aluminum oxide, polyimide, or other potential materials as necessary for growth on top of the piezoelectric layer 1512. The insulating layer 1520 can act to prevent harmful materials from the piezoelectric layer 1512 such as lead in PZT to contact the environment or the user. Additionally, the insulating layer 1520 may insulate the electrical signals going to electrode layer 1508 from traveling to electrode layer 1510, and vice versa.

Figure 16:
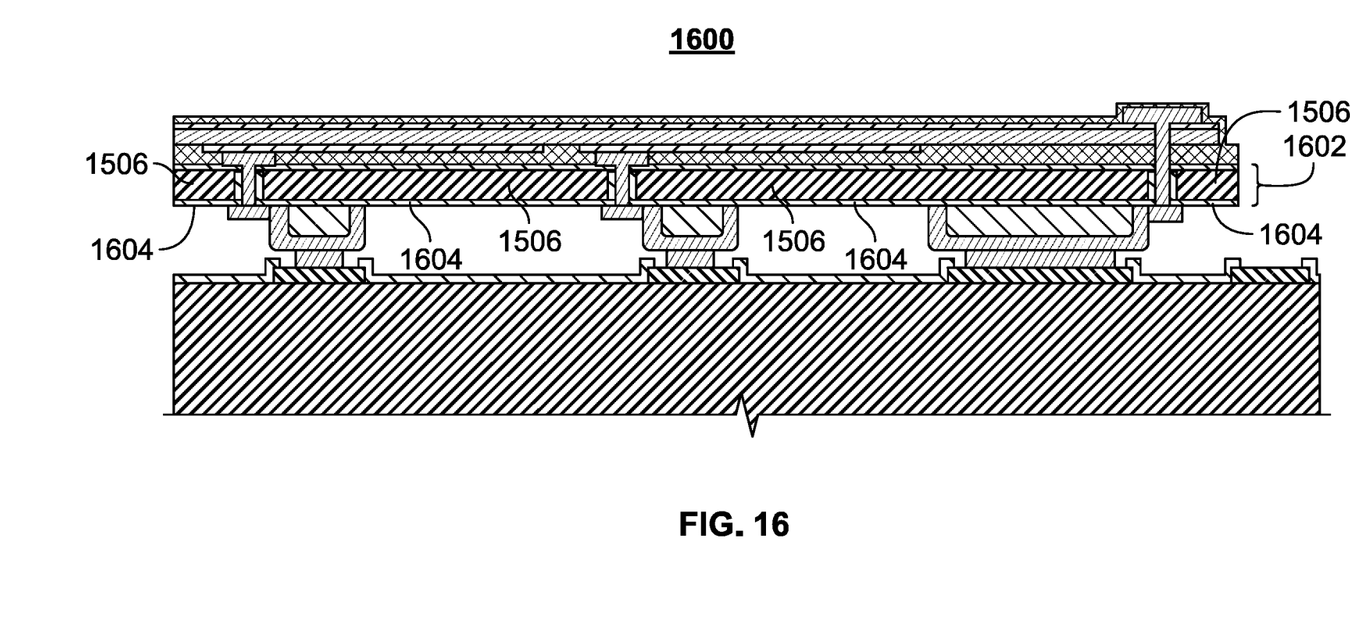
FIG. 16 shows a PMUT structure including a piezoelectric layer with a conductive structural layer in accordance with one embodiment of the present disclosure.

FIG. 16 shows a piezoelectric PMUT structure 1600 with a conductive structural layer 1602 in accordance with one embodiment of the present disclosure. The piezoelectric PMUT structure 1600 can be obtained by growing an insulating layer 1604 surrounding the conductive structural layer 1602 before and after depositing the dielectric structural layer 1506 such that the insulating layer 1604 may extend around and fully cover the dielectric structural layer 1506. The conductive structural layer 1602 may comprise the insulating layer 1604 and a dielectric structural layer 1506. The insulating layer 1604 prevent shorting between the conductive structural layer and the electrodes.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A piezoelectric micromachined ultrasound transducer (PMUT) device, comprising:
    a structural layer;
    an electrical component layer parallel to the structural layer;
    a first electrode located between the structural layer and the electrical component layer, wherein the first electrode includes a first planar surface parallel to the structural layer;
    a second electrode located between the structural layer and the electrical component layer, wherein the second electrode includes a second planar surface parallel to the first planar surface;
    a piezoelectric layer located between the first planar surface and the second planar surface, wherein the piezoelectric layer extends parallel to the first planar surface, wherein the piezoelectric layer generates a mechanical response in response to a signal applied between the first electrode and the second electrode, and
    wherein the piezoelectric layer generates an electrical signal between the first electrode and the second electrode in response to a mechanical stress applied to the piezoelectric layer; and
    one or more barrier layers, comprising:
        a first barrier layer covering the first planar surface that prevents diffusion of the piezoelectric layer into the first electrode; and
        a second barrier layer covering the second planar surface that prevents diffusion of the piezoelectric layer into the second electrode.

2. The PMUT device of claim 1, wherein at least one of the first barrier layer or the second barrier layer comprises a strontium ruthenium trioxide ($SrRuO_3$) film.

3. The PMUT device of claim 1, wherein the first electrode and the second electrode each comprise a platinum, molybdenum, or aluminum material.

4. The PMUT device of claim 1, wherein the first barrier layer is in contact with the piezoelectric layer and located between the piezoelectric layer and the first electrode, wherein the second barrier layer is in contact with the piezoelectric layer and located between the piezoelectric layer and the second electrode, wherein the first barrier layer and the second barrier layer cover a first portion of the piezoelectric layer, and wherein the one or more barrier layers further comprise:
    at least one additional barrier layer in contact with the piezoelectric layer, wherein the at least one additional barrier layer covers a second portion of the piezoelectric layer.

5. The PMUT device of claim 4, wherein the first barrier layer, the second barrier layer, and the at least one additional barrier layer surround the piezoelectric layer.

6. The PMUT device of claim 5, wherein the first barrier layer, the second barrier layer, and the at least one additional barrier layer completely surround the piezoelectric layer.

7. The PMUT device of claim 4, wherein the first barrier layer and the second barrier layer comprise a conductive layer, and wherein the at least one additional barrier layer comprises an insulating layer.

8. The PMUT device of claim 7, wherein the first barrier layer is in contact with the first electrode and the second barrier layer is in contact with the second electrode.

9. The PMUT device of claim 7, further comprising a first electrical connection from the electrical component layer and the first electrode and a second electrical connection between the electrical component layer and the second electrode, wherein the at least one additional barrier layer is located between the piezoelectric layer and each of the first electrical connection and the second electrical connection.

10. The PMUT device of claim 9, wherein the at least one additional barrier layer comprises:
    a first additional barrier layer in contact with the first electrical connection; and
    a second additional barrier layer in contact with the second electrical connection.

11. The PMUT device of claim 4, further comprising an insulating buffer layer in contact with the first electrode and a silicon layer and a standoff in contact with the second electrode.

12. The PMUT device of claim 11, wherein the first barrier layer prevents diffusion from the piezoelectric layer into the silicon layer and the second barrier layer prevents diffusion from the piezoelectric layer into the standoff.

13. The PMUT device of claim 12, wherein the at least one additional barrier layer further prevents diffusion from the piezoelectric layer into the silicon layer.

14. The PMUT device of claim 11, wherein the first barrier layer and the first electrode overlap the piezoelectric layer and the silicon layer, and wherein the second barrier layer and the second electrode overlap the piezoelectric layer and the standoff.

15. The PMUT device of claim 1, wherein the electrical component layer comprises a CMOS layer.

16. The PMUT device of claim 1, wherein the piezoelectric layer comprises lead zirconate titanate (PZT), lead magnesium niobite-lead zirconate titanate (PMN-PZT), or lead zinc niobite-lead titanate (PZN-PT).

17. The PMUT device of claim 1, wherein the one or more barrier layers comprises $Al_2O_3$, $TiO_2$, $SiO_2$, Ir, LNO, $Si_3N_4$, YSZ, MgO, $TiO_x$, or $ZrO_2$.

18. A piezoelectric micromachined ultrasound transducer (PMUT) device, comprising:
   a structural layer;
   an electrical component layer parallel to the structural layer;
   a first electrode disposed adjacent to and over the structural layer, wherein the first electrode includes a first planar surface parallel to the structural layer;
   a second electrode disposed adjacent to and over the structural layer, wherein the second electrode includes a second planar surface parallel to the first planar surface;
   a piezoelectric layer located between the first planar surface and the second planar surface, extending parallel to the first planar surface, wherein the piezoelectric layer generates a mechanical response in response to a signal applied between the first electrode and the second electrode, and wherein the piezoelectric layer generates an electrical signal between the first electrode and the second electrode in response to a mechanical stress applied to the piezoelectric layer; and
   one or more barrier layers, comprising:
      a first barrier layer covering the first planar surface that prevents diffusion of the piezoelectric layer into the first electrodes; and
      a second barrier layer covering the second planar surface that prevents diffusion of the piezoelectric layer into the second electrode.

19. A method for fabricating a piezoelectric micromachined ultrasound transducer (PMUT) device, comprising:
   providing a structural layer;
   depositing a first conducting layer over the structural layer, wherein the first conducting layer includes a first planar surface parallel to the structural layer;
   depositing a first barrier layer over the first conducting layer;
   depositing a piezoelectric layer over the first barrier layer;
   depositing a second barrier layer over the piezoelectric layer;
   depositing a second conducting layer over the structural layer, wherein the second conducting layer includes a second planar surface parallel to the first planar surface, and wherein the piezoelectric layer extends parallel to the first planar surface;
   patterning the second conducting layer;
   etching the piezoelectric layer based at least in part on the patterning of the second conducting layer; and
   depositing a third barrier layer over the second conducting layer, the piezoelectric layer, and the first conducting layer.

* * * * *